(12) United States Patent
Wang

(10) Patent No.: US 9,397,227 B2
(45) Date of Patent: Jul. 19, 2016

(54) SPLIT GATE FLASH CELL SEMICONDUCTOR DEVICE

(71) Applicant: WaferTech, LLC, Camas, WA (US)

(72) Inventor: Yimin Wang, Camas, WA (US)

(73) Assignee: WAFERTECH, LLC, Camas, WA (US)

( * ) Notice: Subject to any disclaimer, the term of this patent is extended or adjusted under 35 U.S.C. 154(b) by 0 days.

(21) Appl. No.: 14/993,821

(22) Filed: Jan. 12, 2016

(65) Prior Publication Data

US 2016/0126359 A1    May 5, 2016

Related U.S. Application Data

(60) Division of application No. 14/561,597, filed on Dec. 5, 2014, now Pat. No. 9,257,515, which is a continuation of application No. 14/038,410, filed on Sep. 26, 2013, now Pat. No. 8,921,917, which is a division of application No. 12/983,057, filed on Dec. 31, 2010, now Pat. No. 8,557,696.

(51) Int. Cl.
*H01L 29/788*    (2006.01)
*H01L 27/115*    (2006.01)

(52) U.S. Cl.
CPC ...... *H01L 29/7883* (2013.01); *H01L 27/11519* (2013.01); *H01L 27/11521* (2013.01)

(58) Field of Classification Search
USPC .......... 257/320, 298, 321; 438/257, 262–267, 438/591–593, 595
See application file for complete search history.

(56) References Cited

U.S. PATENT DOCUMENTS

| | | | |
|---|---|---|---|
| 5,970,371 | A | 10/1999 | Hsieh et al. |
| 6,174,772 | B1 | 1/2001 | Hsieh et al. |
| 6,333,228 | B1 | 12/2001 | Hsieh et al. |
| 7,186,615 | B2 | 3/2007 | Liu |
| 2007/0181935 | A1 | 8/2007 | Hyun et al. |

*Primary Examiner* — Errol Fernandes
(74) *Attorney, Agent, or Firm* — Duane Morris LLP

(57) ABSTRACT

A split gate flash cell device with floating gate transistors is provided. Each floating gate transistor is formed by providing a floating gate transistor substructure including an oxide disposed over a polysilicon gate disposed over a gate oxide disposed on a portion of a common source. Nitride spacers are formed along sidewalls of the floating gate transistor substructure and cover portions of the gate oxide that terminate at the sidewalls. An isotropic oxide etch is performed with the nitride spacers intact. The isotropic etch laterally recedes opposed edges of the oxide inwardly such that a width of the oxide is less than a width of the polysilicon gate. An inter-gate dielectric is formed over the floating gate transistor substructure and control gates are formed over the inter-gate dielectric to form the floating gate transistors.

20 Claims, 4 Drawing Sheets

SPLIT GATE FLASH CELL SEMICONDUCTOR DEVICE

RELATED APPLICATIONS

This application is a divisional of U.S. patent application Ser. No. 14/561,597, filed Dec. 5, 2014, which is a continuation of U.S. patent application Ser. No. 14/038,410, filed Sep. 26, 2013, and which issued on Dec. 30, 2014 as U.S. Pat. No. 8,921,917, which is a divisional of U.S. patent application Ser. No. 12/983,057, filed Dec. 31, 2010, and which issued on Oct. 15, 2013, as U.S. Pat. No. 8,557,696. The contents of each of the aforementioned applications are hereby incorporated by reference as if set forth in their entireties.

TECHNICAL FIELD

The disclosure relates to semiconductor flash memory devices and methods for making the same.

BACKGROUND

A flash memory is a non-volatile storage device that can be electrically erased and reprogrammed. Flash memories are commonly used in memory cards, USB flash drives and solid-state drives for general storage and transfer of data between computers and other digital products. Flash memory devices typically store information in an array of memory cells made using floating gate transistors.

A floating gate transistor is a field effect transistor having a structure similar to a conventional MOSFET (metal oxide semiconductor field effect transistor). Floating gate MOSFETs are distinguished from conventional MOSFETs because the floating gate transistor includes two gates instead of one. In addition to an upper control gate, a floating gate transistor includes an additional floating gate beneath the control gate and above the transistor channel but completely electrically isolated by an insulating layer such as an oxide layer that completely surrounds the floating gate. This electrically isolated floating gate creates a floating node in DC with a number of inputs or secondary gates such as the control gate, formed above the floating gate and electrically isolated from it. These secondary gates or inputs are only capacitively connected to the floating gate. Because the floating gate is completely surrounded by highly resistive material, i.e. the insulating layer, any charge placed on the floating gate is trapped there and the floating gate remains unchanged for long periods of time until the floating gate MOSFET is erased. Unless erased, the floating gate will not discharge for many years under normal conditions. Fowler-Nordheim Tunneling or other Hot-Carrier injection mechanisms may be used to modify the amount of charge stored in the floating gate, e.g. to erase the floating gate. The erase operation is therefore critical to the operation of floating gate transistors.

The default state of an NOR ("Not Or" electronic logic gate) flash cell is logically equivalent to a binary "one" value because current flows through the channel under application of an appropriate voltage to the control gate when charge is stored in the floating gate. Such a flash cell device can be programmed or set to binary "zero" by applying an elevated voltage to the control gate.

To erase such a flash cell, i.e. resetting it to the "one" state, a large voltage of the opposite polarity is applied between the control gate and the source causing electrons to exit the floating gate through quantum tunneling. In this manner, the electrical charge is removed from the floating gate. This tunneling necessarily takes place through the inter-gate dielectric formed between the floating gate and the control gate. It is therefore important to provide a floating gate transistor having an inter-gate dielectric with an appropriate thickness and having an appropriate configuration that will promote the creation of a strong electric field that enables tunneling and allows for the flash cell device to be erased.

The disclosure addresses these concerns.

BRIEF DESCRIPTION OF THE DRAWINGS

The present invention is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout the specification and drawings.

DETAILED DESCRIPTION

Figure 1:
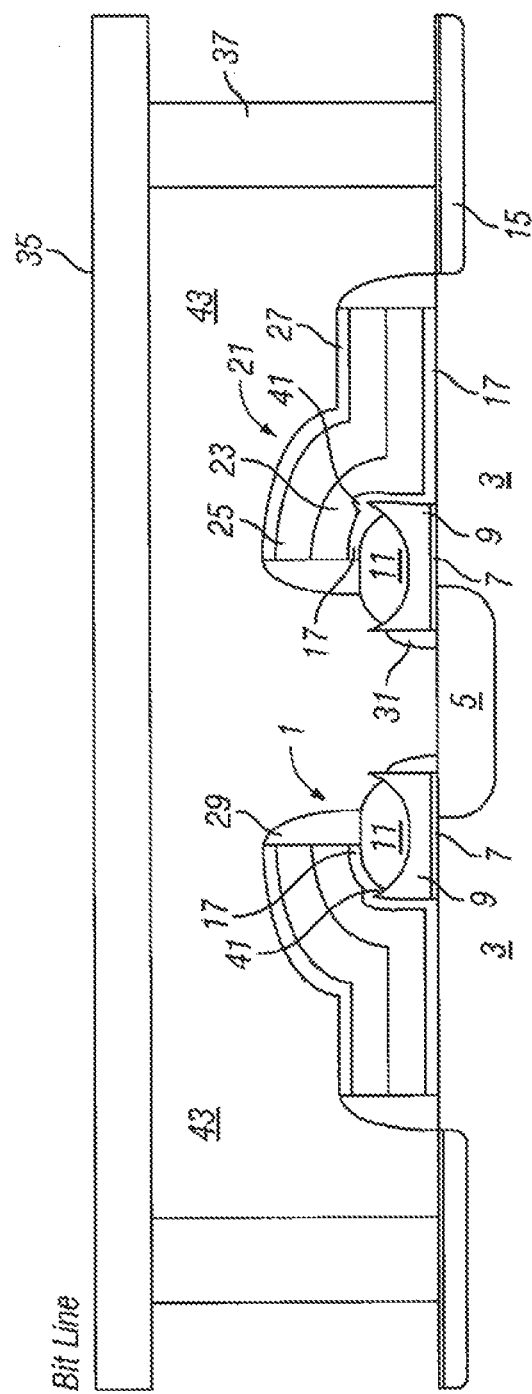
FIG. 1 is a cross-sectional view showing a split gate flash cell device formed according to the invention.

FIG. 1 is a cross-sectional view showing a split gate flash cell device formed according to the invention. The flash device includes two floating gate transistors 1 formed over substrate 3. Common source region 5 is formed within substrate 3 and each floating gate transistor 1 is formed at least partially over common source region 5. In the illustrated embodiment, each floating gate transistor 1 is formed partially over opposed ends of common source region 5. Each floating gate transistor 1 includes gate dielectric 7, floating gate 9 and floating gate oxide 11. Floating gate 9 is most advantageously formed of polysilicon but other forms of silicon and other semiconductor materials may be used in other exemplary embodiments. According to the embodiment in which floating gate 9 is formed of polysilicon, floating gate 9 may be locally oxidized to form all or part of floating gate oxide 11. Floating gate oxide 11 may be formed of one or more separately formed oxide materials. According to one exemplary embodiment, floating gate oxide 11 may be formed of a first oxide portion formed by thermally oxidizing a localized portion of the polysilicon gate material and an HTO (high temperature oxidation) or other oxide formed over the first oxide portion and further portions of floating gate 9.

In the program state, charge, i.e. electrons are stored in floating gate 9, cell current is zero and the channel under floating gate transistor 1 is off. In the erased state, charge is not present in floating gate 9, cell current is "one" and the channel under floating gate transistor 1 is on.

Inter-gate dielectric 17 is formed over floating gate oxide 11 with control gate 21 formed over inter-gate dielectric 17. Control gate 21 may include polysilicon portion 23 and silicide portion 25 in various embodiments and may also include passivation layer 27. Control gate 21 may be formed of various other semiconductor or conductive materials or combinations of materials in other exemplary embodiments. Spacers 29 and 31 may be formed of various suitable materials and for various applications. Spacers 29 and 31 may be oxide spacers, nitride spacers or composite spacers such as oxide/nitride/oxide in various exemplary embodiments and depending upon technology. Floating gate transistors 1 have separate drains 15 coupled to bit line 35 by respective vias 37. Control gate 21 is an electrode and serves as the word line. Conventional methods and materials may be used for bit line 35 and vias 37 formed in interlevel dielectric 43.

Each floating gate transistor 1 is erased by electrons tunneling through the oxide regions from floating gate 9 to control gate 21. Crucial factors with respect to erase performance include the thickness and quality of the inter-gate dielectric 17 and the tip profile at edge 41. The electron tunneling required for erasing a floating gate transistor occurs most easily at the location of a concentrated electric field. The shape of edge 41 is critical to providing a strong electric field at edge 41. It is generally desirable for edge 41 to take the shape of a sharp edge as opposed to a more rounded structure.

The present invention provides a processing sequence that provides a well controlled and advantageously shaped edge 41 that is advantageous in the formation of a desirably concentrated electric field advantageous for electron tunneling through inter-gate dielectric 17. Such electron tunneling constitutes the erase mechanism for floating gate transistors 1.

Figure 2:
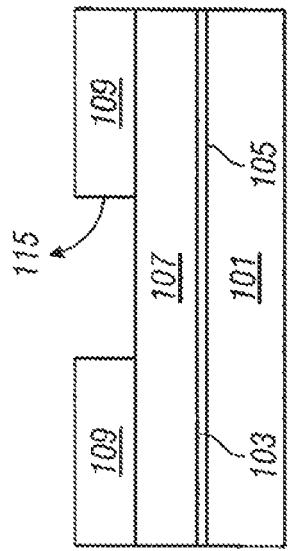
FIGS. 2-10 are cross-sectional views illustrating a sequence of processing operations used to form a floating gate transistor according to exemplary embodiments of the invention.

FIGS. 2-10 show a sequence of processing operations that can be used to form floating gate transistors such as the two floating gate transistors 1 shown in FIG. 1. FIG. 2 shows substrate 101 with gate oxide layer 103 formed over substrate surface 105. Silicon film 107 is formed over gate oxide layer 103 and may advantageously be a polysilicon layer or another semiconductor material according to various exemplary embodiments. Silicon layer 107 may include a thickness ranging from about 1000 to 1200 angstroms according to various exemplary embodiments but different thicknesses may be used in other exemplary embodiments. Gate oxide layer 103 may advantageously include a thickness of about 80-100 angstroms, but other suitable thicknesses may be appropriate depending on application and may be used in other exemplary embodiments. Nitride layer 109 is formed over silicon layer 107 and patterned photoresist layer 111 is formed over nitride layer 109. Nitride layer 109 may be a silicon nitride layer, a silicon oxynitride layer or other suitable nitride layers. Opening 113 formed in patterned photoresist layer 111 will be used to define and form the gate region for a floating gate transistor. Various suitable conventional methods are known and available and may be used to form the films illustrated in FIG. 2 and to pattern photoresist layer 111.

Figure 3:
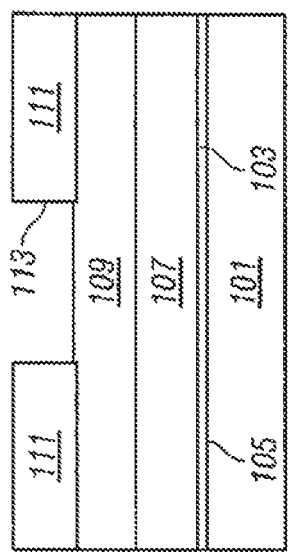

Patterned photoresist layer 111 serves as a photomask during a nitride etching operation which is followed by a photoresist stripping operation to produce the structure shown in FIG. 3. Opening 115 in patterned nitride layer 109 defines the gate region for a floating gate transistor that will be formed according to subsequent processing operations.

Opening 115 of patterned nitride layer 109 exposes an exposed portion of silicon layer 107 that will become locally oxidized. With patterned nitride layer 109 serving as a masking layer, various implantation operations may be performed on the structure shown in FIG. 3 such as to control the threshold voltage, $V_t$ of the floating gate transistor and to influence the oxidation characteristics of silicon layer 107 in a subsequent oxidation operation. Various implant dosages and energies may be used and various implant species may be used. In one exemplary embodiment, a phosphorous species may be implanted into silicon layer 107 through opening 115 in patterned nitride layer 109 to control or influence the oxidation of the exposed portion of silicon layer 107.

Figure 4:
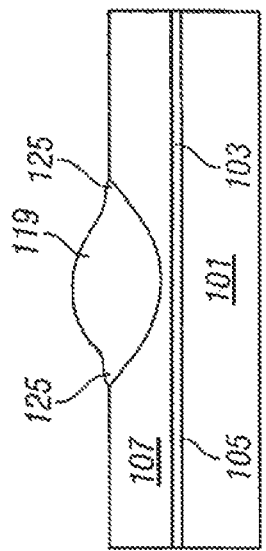

After the implantation operation, an oxidation operation is carried out and only the exposed portions of silicon layer 107 are "locally" oxidized to produce floating gate oxide 119 as in FIG. 4. Floating gate oxide 119 is generally biconvex in shape having a maximum thickness 121 centrally located and having opposed edges 125 that substantially form tips or vertices.

Figure 5:
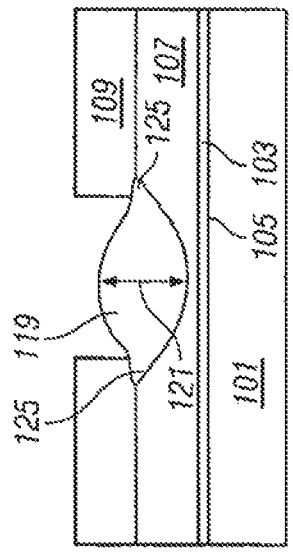
Figure 6A:
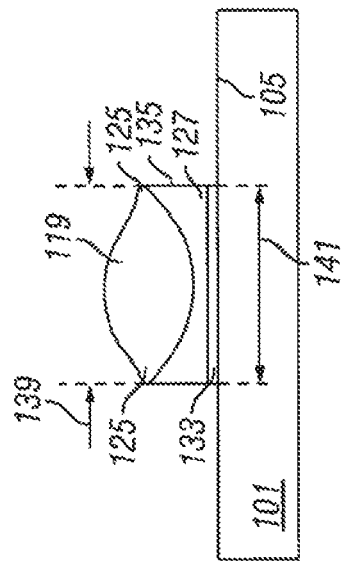
Figure 6B:
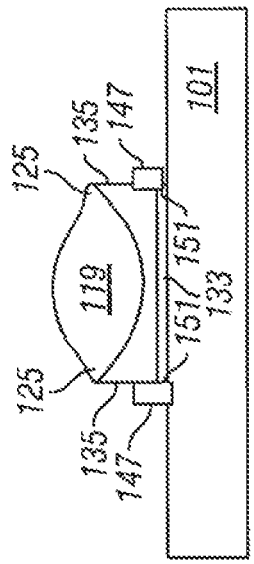
Figure 8:
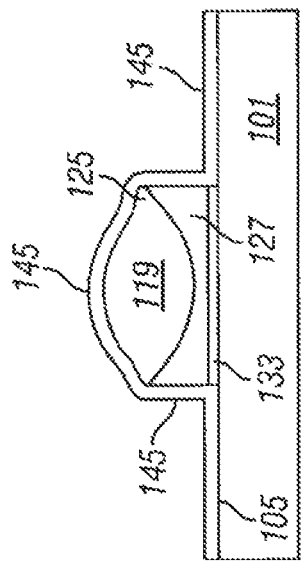

Silicon nitride layer 109 is stripped to produce the structure shown in FIG. 5. The structure shown in FIG. 5 then undergoes a patterning and etching operation to form gate structures and, depending on processing conditions, the resulting structure may be as illustrated in FIG. 6A or FIG. 6B. According to one exemplary embodiment in which silicon film 107 is polysilicon, a conventional patterning operation using conventional photoresist masking material may be used. Following the removal of unprotected portions of silicon layer 107 using a polysilicon etch operation, a further etching operation is carried out to remove portions of gate oxide layer 103 not covered by floating gate oxide 119 and the remaining, unetched portion of silicon layer 107.

Now turning to FIGS. 6A and 6B, surface 105 of substrate 101 is exposed in the non-gate areas after the removal of silicon film 107 and gate oxide layer 103 from these regions. The etching operations produce floating gate 127 from silicon film 107 and gate oxide 133 from gate oxide layer 103 thereby defining the gate area. Floating gate 127 has a generally concave upper surface and floating gate 127 and gate oxide 133 each terminate laterally at opposed sidewalls 135. Depending on the etching conditions and etching species, the etched structure may demonstrate undercut such as shown in FIG. 6A or there may be no appreciable undercut such as shown in FIG. 6B. In FIG. 6A, the undercut is illustrated as tips 125 extend laterally outward distally past sidewalls 135, i.e. width 139 of floating gate oxide 119 is greater than gate width 141 shown in FIG. 6A but width 139 of floating gate oxide 119 is substantially the same as gate width 141 in FIG. 6B.

Figure 7:
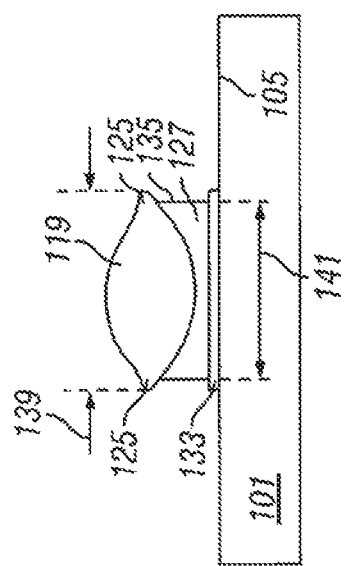

A nitride layer is then formed over the structure shown in FIG. 6A or 6B. FIG. 7 shows nitride layer 145 formed over the structure substantially shown in FIG. 6B but the nitride film may be formed over a structure similar to the structure shown in FIG. 6A that exhibits undercut, in other exemplary embodiments.

Now referring to FIG. 7, nitride layer 145 is formed over the gate structure including over floating gate oxide 119 and surface 105 of substrate 101. Nitride layer 145 may include a thickness of about 200 angstroms in one exemplary embodiment, but may include a thickness of 100-500 angstroms or other suitable thicknesses in other exemplary embodiments. After nitride layer 145 is formed such as shown in FIG. 7, an anisotropic etch operation is carried out to produce nitride spacers 147 shown in FIG. 8. Nitride spacers 147 extend along sidewalls 135 and at least cover opposed ends 151 of gate oxide 133.

Figure 9:
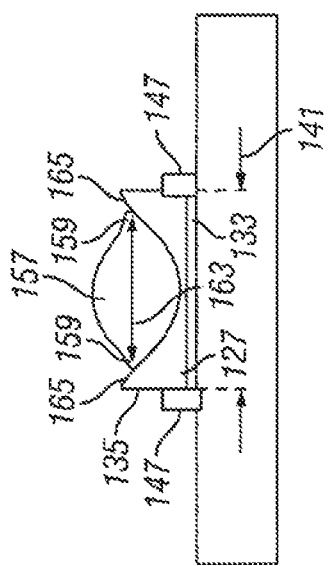

With nitride spacers 147 in place, an isotropic oxide etch operation is carried out which laterally recedes the opposed edges of the floating gate oxide inwardly. According to one exemplary embodiment, a conventional wet oxide etching operation may be used to reduce the size of floating gate oxide 119. FIG. 9 shows diminished floating gate oxide 157 with receded edges 159. Diminished floating gate oxide 157 generally retains the shape of a biconvex shape and receded edges 159 are generally outwardly convex in shape. Width 163 of diminished floating gate oxide 157 is less than gate width 141 and neither of receded edges 159 extend to sidewall 135. With the recession of receded edges 159 of diminished floating gate oxide 157, exposed portions 165 of the upper surface of floating gate 127 appear adjacent sidewalls 135.

Figure 10:
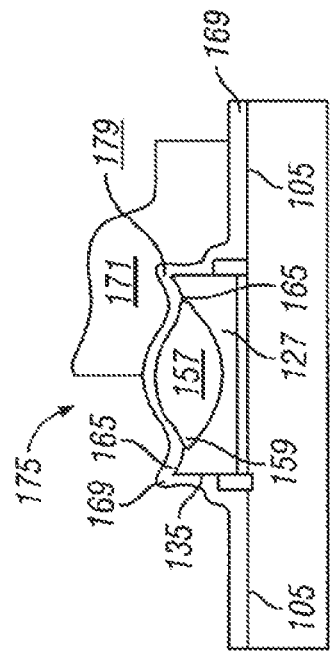

Further steps in the formation of the floating gate transistor are illustrated in FIG. 10. Inter-gate oxide 169 is formed over diminished floating gate oxide 157 and exposed portions 165 of floating gate 127 as well as along sidewalls 135 and surface 105 of substrate 101. Various oxide formation techniques may be used to form inter-gate dielectric 169 such as HTO, high temperature oxidation. In other exemplary embodiments, other thermal oxidation growth techniques or other oxide deposition methods may be used to form inter-gate dielectric 169. FIG. 10 illustrates that inter-gate dielectric 169 is deposited over diminished floating gate oxide 157 and exposed portions 165 of floating gate 127 including over a tip of floating gate 127. The composite oxide formed over floating gate 127 and serving as the floating gate oxide, is the combination of diminished floating gate oxide 157 and inter-gate dielectric 169. Edge 179 of this composite floating gate oxide structure is a substantially thin portion of inter-gate dielectric 169 over a relatively sharp tip of floating gate 127 and is suitable for electron tunneling during an erasure operation that erases floating gate transistor 175.

Control gate 171 is formed over inter-gate dielectric 169 according to conventional methods and may consist of polysilicon or other suitable materials and according to the embodiment in which polysilicon is used, control gate 171 may include a silicide layer formed over the polysilicon portion. Control gate 171 includes an inwardly extending notch at edge 179 over the tip of floating gate 127 due to the thickness and nature of inter-gate dielectric 169. Conventional photolithographic patterning techniques may be used to pattern the structure and etch operations may be used to remove portions of control gate 171 not covered by the photomasking material, as shown in FIG. 10. Inter-gate dielectric 169 remains intact over floating gate transistor 175 and along sidewalls 135 and also over surface 105 on the illustrated embodiment of FIG. 10, but will have portions subsequently removed. Control gate 171 only extends partially over floating gate transistor 175 which is similar in appearance to floating gate transistor 1 shown on the right hand side of FIG. 1. It should be understood that, simultaneous to the formation of floating gate transistor 175 shown in FIGS. 2-10, a plurality of other similar or identical floating gate transistors such as floating gate transistor 1 shown on the left hand side of FIG. 1, may be formed. Conventional subsequent processing operations may be carried out to form the split gate flash device shown in FIG. 1. For example, inter-gate dielectric 169 may be removed from floating gate transistor 175 and sidewalls 175 in regions not covered by control gate 171.

According to some embodiments, the disclosure provides a method for forming a floating gate transistor. The method comprises providing a floating gate transistor substructure including an oxide disposed over a silicon gate disposed over a gate oxide disposed on a substrate. The method includes forming nitride spacers along sidewalls of the floating gate transistor substructure, the nitride spacers covering end portions of the gate oxide that terminate at the sidewalls, performing an oxide etch that laterally recedes opposed edges of the oxide inwardly such that a width of the oxide is less than a width of the silicon gate, and forming an inter-gate dielectric over the floating gate transistor substructure and a silicon layer over the inter-gate dielectric.

According to another aspect, provided is a method for forming a split gate flash cell with floating gate transistors. The method comprises forming a common source area in a substrate and forming a duality of floating gate transistors over respective portions of the common source. Each floating gate transistor is formed by providing a floating gate transistor substructure including an oxide disposed over a polysilicon gate disposed over a gate oxide disposed on a respective one of the portions of the common source area. Nitride spacers are formed along sidewalls of the floating gate transistor substructure, the nitride spacers covering portions of the gate oxide that terminate at the sidewalls. An isotropic oxide etch is performed. The isotropic oxide etch laterally recedes opposed edges of the oxide inwardly such that a width of the oxide is less than a width of the polysilicon gate. An inter-gate dielectric is formed over the floating gate transistor substructure. The method further includes forming a further polysilicon layer over the respective inter-gate dielectrics and patterning the further polysilicon layer to form a control polysilicon gate over each of the floating gate transistors.

According to another aspect, provided is a split gate flash cell semiconductor device comprising a common source area formed in a substrate and a duality of floating gate transistors disposed over at least a portion of the common source. Each floating gate transistor comprises a gate oxide layer formed on a surface of the substrate and a polysilicon gate formed on the gate oxide. The polysilicon gate has a concave upper surface, includes a gate width and terminates laterally at opposed sidewalls. A floating gate oxide is disposed on the polysilicon gate and includes a bottom forming a conterminous boundary with the concave upper surface. The floating gate oxide includes an inner oxide portion having a generally biconvex shape with a maximum central thickness, a pair of opposed edges forming vertices and a width less than the gate width, and an outer oxide portion comprising an oxide layer covering the inner oxide portion and disposed directly on portions of the polysilicon gate adjacent the sidewalls. A patterned control gate layer including a control gate electrode portion is disposed at least partially over each floating gate transistor.

The preceding merely illustrates the principles of embodiments of the disclosure. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A floating gate transistor comprising:
    a floating gate transistor substructure including a silicon gate disposed over a gate oxide disposed on a substrate;
    spacers along sidewalls of said floating gate transistor substructure, including on sidewalls of said silicon gate;
    an inter-gate dielectric disposed over said floating gate transistor substructure; and
    a silicon layer with a lower surface disposed over said inter-gate dielectric and said silicon gate, said lower surface facing said silicon gate and including both concave and convex portions overlying an uppermost surface of said floating gate transistor substructure.

2. The floating gate transistor as in claim 1, further comprising an oxide disposed over said silicon gate and wherein said oxide includes a width less than a width of said silicon gate.

3. The floating gate transistor as in claim 1, wherein said silicon gate includes a concave upper surface.

4. The floating gate transistor as in claim 1, wherein said spacers are nitride spacers that directly cover end portions of said gate oxide that terminate at said sidewalls.

5. The floating gate transistor as in claim 1, wherein said silicon layer comprises a control gate and said lower surface is conterminous with portions of said inter-gate dielectric.

6. The floating gate transistor as in claim 5, wherein said control gate includes an inwardly extending notch at a location where said control gate extends over an upper edge of said silicon gate.

7. The floating gate transistor as in claim 5, wherein said control gate extends over only a portion of said floating gate transistor substructure and also extends along a sidewall thereof.

8. The floating gate transistor as in claim 1, wherein said silicon gate includes a concave upper surface and further comprising an oxide disposed over and conterminous with said concave upper surface, said oxide being bi-convex in shape and including a centrally located maximum thickness portion and a duality of opposed lateral ends that substantially form vertices, and further comprising a silicide layer on said silicon layer.

9. The floating gate transistor as in claim 1, wherein each of said spacers is a composite structure formed of a nitride layer disposed between two oxide layers.

10. A split gate flash cell semiconductor device comprising:
    a duality of floating gate transistors sharing a common source area formed in a substrate, each of said floating gate transistors comprising:
    a floating gate formed on a gate oxide layer, said floating gate terminating laterally at opposed sidewalls;
    a floating gate dielectric disposed on said floating gate and having a bottom forming a conterminous boundary with an upper surface of said floating gate, said floating gate dielectric including a dielectric layer disposed directly on portions of said upper surface; and
    a control gate electrode including a lower surface disposed partially over said floating gate dielectric, said lower surface including both concave and convex portions overlying an uppermost surface of said floating gate dielectric.

11. The split gate flash cell semiconductor device as in claim 10, wherein each of said duality of floating gate transistors is disposed over at least a portion of said common source.

12. The split gate flash cell semiconductor device as in claim 10, wherein said floating gate comprises a polysilicon gate, said upper surface comprises a concave upper surface, and said floating gate dielectric includes an inner oxide portion having a bi-convex shape and an outer portion comprising said dielectric layer.

13. The split gate flash cell semiconductor device as in claim 10, wherein said control gate electrode includes an inwardly extending notch at a location where said control gate electrode extends over an upper edge of said floating gate.

14. The split gate flash cell semiconductor device as in claim 10, further comprising, for each said floating gate transistor, a nitride spacer disposed along and conterminous with each of said opposed sidewalls and conterminous with opposed ends of said gate oxide layer.

15. The split gate flash cell semiconductor device as in claim 14, wherein, for each said floating gate transistor, said upper surface comprises a concave upper surface, said floating gate dielectric includes an inner oxide portion having a bi-convex shape and an outer portion comprising said dielectric layer, said control gate electrode includes an upper surface formed of a silicide material and, further comprising nitride spacers disposed on and directly contacting each of said opposed sidewalls of said floating gate and directly covering end portions of said gate oxide layer.

16. A split gate flash cell semiconductor device comprising:
    a duality of floating gate transistors sharing a common source area formed in a substrate, each of said floating gate transistors comprising:
    a floating gate transistor substructure including a floating gate disposed over a gate dielectric disposed on said substrate, said floating gate terminating laterally at opposed sidewalls;
    a floating gate dielectric disposed over said floating gate;
    spacers covering respective end portions of said gate dielectric that terminate at said opposed sidewalls; and
    a control gate electrode including a lower surface including both concave and convex portions disposed over and facing, an uppermost surface of said floating gate transistor substructure.

17. The split gate flash cell semiconductor device as in claim 16, wherein said spacers are composite structures including a nitride layer disposed between two oxide layers and said spacers directly cover said respective end portions of said gate dielectric.

18. The split gate flash cell semiconductor device as in claim 16, wherein said floating gate includes a concave upper surface and said floating gate dielectric comprises an inter-gate dielectric disposed over and directly contacting an oxide, said inter-gate dielectric directly contacting portions of said concave upper surface and said oxide disposed over and conterminous with said concave upper surface, said oxide being bi-convex in shape and including a centrally located maximum thickness portion and a duality of opposed lateral ends that substantially form vertices.

19. The split gate flash cell semiconductor device as in claim 16, wherein said lower surface includes an inwardly extending notch at a location where said control gate electrode extends over an upper edge of said floating gate.

20. The split gate flash cell semiconductor device as in claim 19, wherein, for each said floating gate transistor, said control gate electrode comprises a silicon layer with a silicide layer thereon, and said control gate extends over only a portion of said respective floating gate transistor substructure and also extends along one of said opposed sidewalls thereof.

* * * * *